(12) United States Patent
Harayama et al.

(10) Patent No.: US 8,039,943 B2
(45) Date of Patent: Oct. 18, 2011

(54) SEMICONDUCTOR DEVICE AND MANUFACTURING METHOD THEREFOR

(75) Inventors: Masahiko Harayama, Kanagawa (JP); Kouichi Meguro, Kanagawa (JP); Junichi Kasai, Kanagawa (JP)

(73) Assignee: Spansion, LLC, Sunnyvale, CA (US)

( * ) Notice: Subject to any disclaimer, the term of this patent is extended or adjusted under 35 U.S.C. 154(b) by 272 days.

(21) Appl. No.: 12/239,566

(22) Filed: Sep. 26, 2008

(65) Prior Publication Data

US 2009/0250800 A1 Oct. 8, 2009

(30) Foreign Application Priority Data

Sep. 28, 2007 (JP) ................. 2007-254537

(51) Int. Cl.
*H01L 23/48* (2006.01)
(52) U.S. Cl. ......... 257/686; 257/E23.085; 257/E25.006; 257/E25.013; 257/E25.021; 257/E25.027

(58) Field of Classification Search .................. 257/686, 257/698, 777, E25.006, E25.013, E25.018, 257/E25.021, E25.027, E23.085
See application file for complete search history.

(56) References Cited

U.S. PATENT DOCUMENTS

| | | | | |
|---|---|---|---|---|
| 6,489,676 B2 * | 12/2002 | Taniguchi et al. | ............ | 257/698 |
| 7,589,410 B2 * | 9/2009 | Kim | ............................. | 257/686 |
| 7,667,338 B2 * | 2/2010 | Lin et al. | ....................... | 257/787 |
| 7,671,457 B1 * | 3/2010 | Hiner et al. | ................... | 257/678 |
| 2002/0060361 A1 * | 5/2002 | Sasaki | ............................ | 257/698 |

* cited by examiner

*Primary Examiner* — Jasmine J Clark

(57) ABSTRACT

A semiconductor device is provided that includes a semiconductor chip and a resin section that molds the semiconductor chip and has a first through-hole. A through electrode that is electrically coupled to the semiconductor chip, extends through the resin section, and extends between a top edge and a bottom edge of an inner surface of the first through-hole. A cavity which extends between planes corresponding to an upper surface and a lower surface of the resin section is formed inside the first through-hole.

4 Claims, 20 Drawing Sheets

SEMICONDUCTOR DEVICE AND MANUFACTURING METHOD THEREFOR

RELATED APPLICATION

This Application claims priority to Japanese Patent Application 2007-254537 entitled "Semiconductor Device and Method for Manufacturing Thereof" filed Sep. 28, 2007 which is incorporated herein in its entirety.

TECHNICAL FIELD

The present invention particularly relates to a semiconductor device and a method for manufacturing the same.

BACKGROUND

In recent years, with miniaturization and sophistication of electronic devices, a number of technologies designed to increase packaging density of semiconductor devices have been developed. Such technologies include chip-on-chip semiconductor device technologies and package-on-package semiconductor device technologies.

FIG. 1 is a cross-sectional view of a conventional chip-on-chip semiconductor device. On an upper surface of an interposer 84, a semiconductor chip 80 having an upper surface on which a circuit is formed is stacked via an adhesive 82. An external electrode (not shown) provided on the upper surface of the semiconductor chip 80 and a connector terminal (not shown) on the interposer 84 are electrically coupled by a wire 86. On a lower surface of the interposer 84, a solder ball 88 for electrically coupling to the outside is provided. On the upper surface of the interposer 84, a resin section 89 to mold the semiconductor chip 80 and the wire 86 is provided. With this configuration, the packaging density of the semiconductor device can be increased as a plurality of semiconductor chips 80 can be provided in a single package.

FIG. 2 is a cross-sectional view of a package-on-package semiconductor device of a second conventional approach. Components of FIG. 2 common to FIG. 1 have been given the same numbers and their explanations are omitted. A first semiconductor package 90 and a second semiconductor package 92 respectively include semiconductor chip 80, adhesive 82, interposers 84a and 84b, wire 86 and resin section 89. A first solder ball 94 provided on a lower surface of the interposer 84a of the first semiconductor package 90 is bonded to an upper surface of the interposer 84b of the second semiconductor package 92. On a lower surface of the interposer 84b of the second semiconductor package 92, a second solder ball 96 for electrically coupling to the outside is provided. With this configuration (since a plurality of semiconductor packages can be vertically stacked) the packaging density of the semiconductor device can be increased.

Other conventional semiconductor device packaging techniques are commonly used in industry. For example, WO99/56313 (FIG. 20) illustrates a semiconductor device in which a plurality of semiconductor packages are stacked by providing a through electrode on a lead frame where a solder ball is provided on a tip of the through electrode. Published Japanese Translation of PCT Application No. JP-T-2000-510993 discloses a semiconductor device in which electronic components and wirings are electrically bonded by using connector pins. Japanese Patent Application Publication No. JP-A-2003-151714 discloses a method for mounting electronic components to a wiring circuit body using crimp pieces.

SUMMARY OF THE INVENTION

An object of the present invention is to provide a semiconductor device and manufacturing method therefore which allows a plurality of semiconductor devices to be stably stacked.

According to one embodiment of the present invention, there is provided a semiconductor device that includes a semiconductor chip and a resin section that molds the semiconductor chip and has a first through-hole. A through electrode that is electrically coupled to the semiconductor chip, runs through the resin section, and continuously runs through a top edge and a bottom edge of an inner surface of the first through-hole. A cavity which continuously runs through planes corresponding to an upper surface and a lower surface of the resin section is formed inside the first through-hole. Utilizing embodiments of the present invention, stacking of semiconductor devices can be performed easily. Consequently, a plurality of semiconductor devices can be stably stacked, whereby packaging density can be increased.

According to another embodiment of the present invention, there is provided a method for manufacturing a semiconductor device that includes electrically coupling a through electrode and a semiconductor chip with each other, and forming a resin section that molds the semiconductor chip, so that the through electrode continuously runs through a top edge and a bottom edge of an inner surface of a first through-hole that penetrates through the resin section. In addition, a cavity is formed inside the first through-hole which continuously runs through planes corresponding to an upper surface and a lower surface of the resin section. Utilizing embodiments of the present invention, the stacking of semiconductor devices can be easily executed. Consequently, a plurality of semiconductor devices can be stably stacked, whereby packaging density can be increased.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Exemplary Semiconductor Devices and Manufacturing Methods

In a chip-on-chip semiconductor device, a plurality of semiconductor chips are mounted in a single semiconductor package. Therefore, good semiconductor chips mounted together with faulty semiconductor chips must be discarded when one of the semiconductor chips mounted is faulty. Moreover, the improvement of yield is hampered because the mounting process is difficult and cost is increased. Furthermore, because semiconductor chips need to be made thinner in order to increase packaging density, problems are encountered because the mounting process is likely to produce faulty devices.

Figure 1:
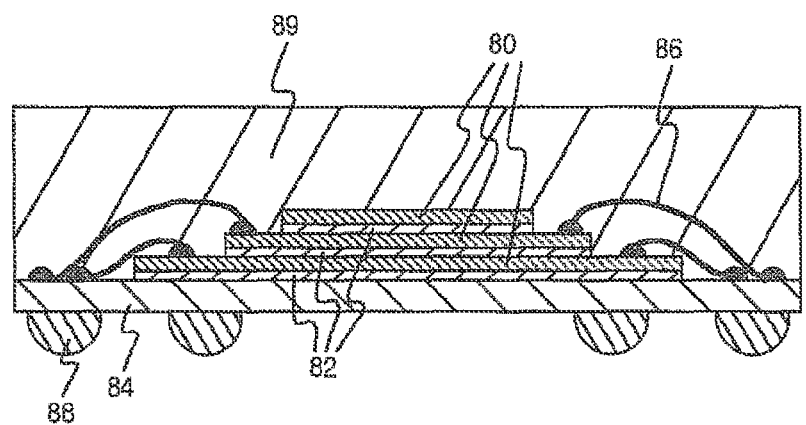
FIG. 1 is a cross-sectional view of a semiconductor device packaged according to a first conventional approach.
Figure 2:
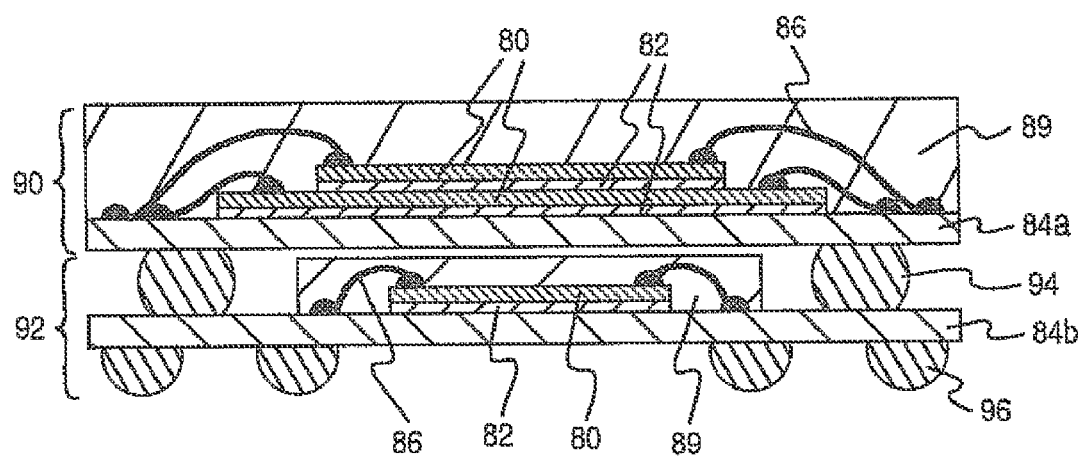
FIG. 2 is a cross-sectional view of a semiconductor device packaged according to a second conventional approach.

In a package-on-package semiconductor device, mechanical performance tests and electrical performance tests are carried out after a semiconductor chip is packaged and only good semiconductor packages are stacked. Furthermore, a semiconductor chip is protected from outside shocks by a resin section. Therefore, yield is higher using package-on-package approaches than chip-on-chip approaches. However, in the package-on-package semiconductor device of FIG. 2, when coupling the first semiconductor package 90 and the second semiconductor package 92 by the solder ball 94, a displacement of the upper and lower semiconductor packages 90 and 92 is likely to occur. When the displacement occurs, a contacting of adjacent solder balls 94 can occur. Embodiments of the present invention that solve the above mentioned problems are described below.

First Embodiment

Figure 3A:
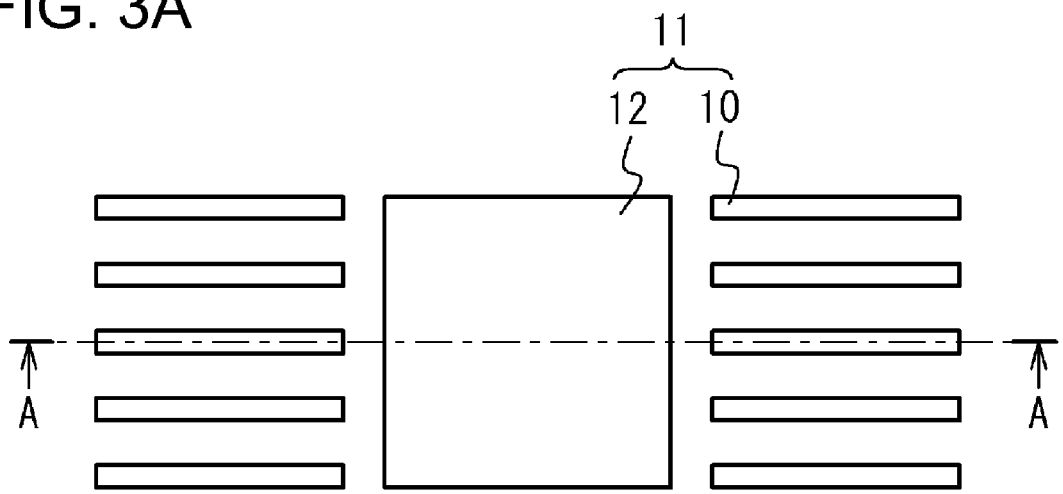
FIG. 3A is an illustration of a semiconductor device manufacturing process of a first embodiment of the present invention.
Figure 3B:
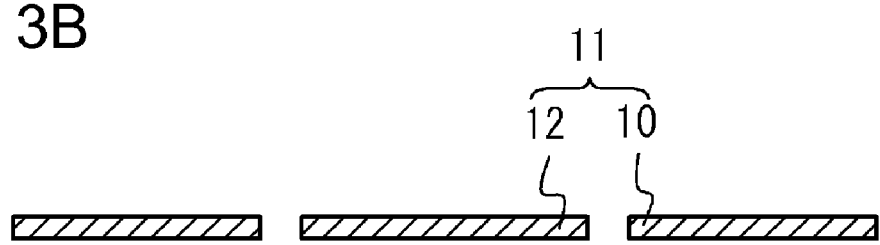
FIG. 3B is a cross-sectional view taken along the line A-A of FIG. 3A.

With reference to FIGS. 3A to 5C, a method for manufacturing a semiconductor device of a first embodiment of the present invention will be described. With reference to FIGS. 3A and 3B, a lead frame 11 including a lead 10 of copper, iron etc. and a mounting section 12 where a semiconductor chip is to be mounted is prepared.

Figure 4A:
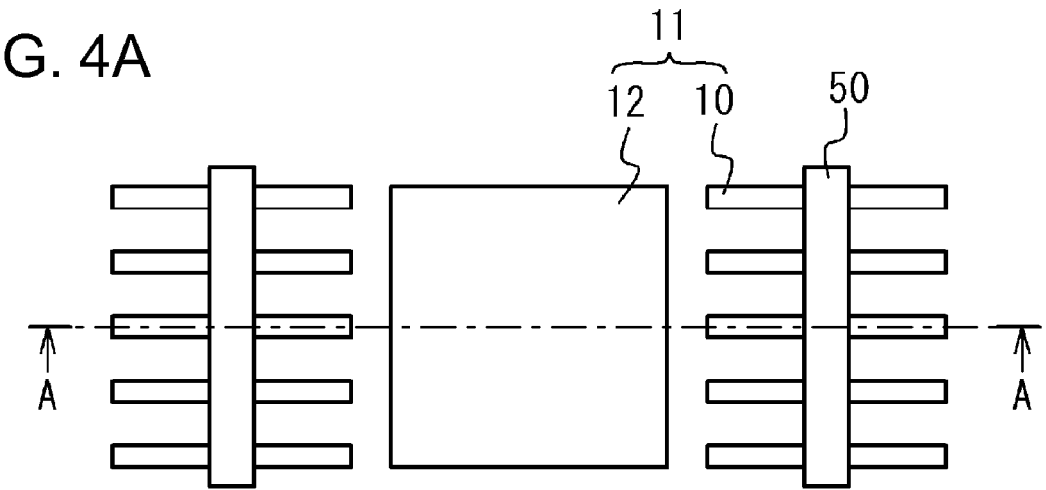
FIG. 4A is a view that illustrates a semiconductor manufacturing process of the first embodiment of the present invention.
Figure 4B:
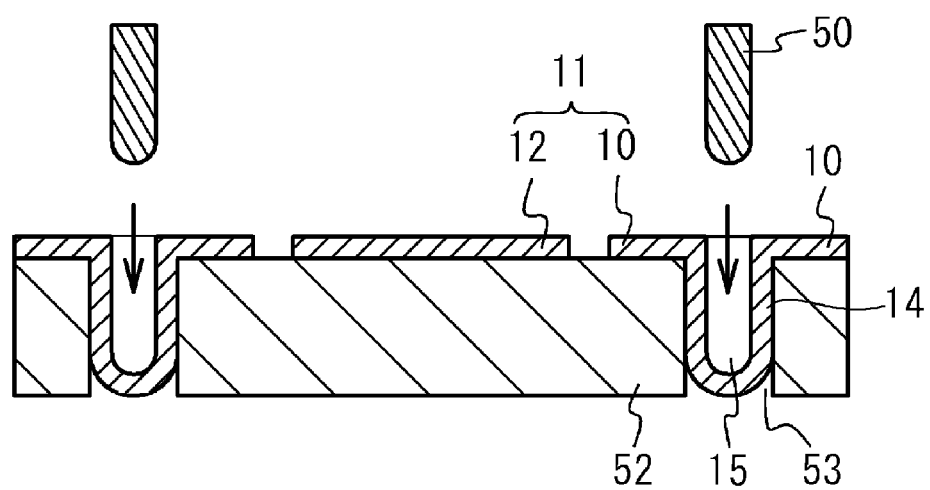
FIG. 4B is a cross-sectional view taken along the line A-A of FIG. 4A.

With reference to FIGS. 4A and 4B, on a die 52, the lead frame 11 is disposed with an upper surface thereof (the surface on which a semiconductor chip is to be mounted) facing down. The die 52 is provided with a hole 53 that forms a recess on the lead 10. From above the lead frame 11, a pressing die 50 is pressed onto the lead 10. The die 50 is configured to fit inside the hole 53 of the die 52. In this manner, a recess 15 is formed on a lower surface of the lead 10 (a surface on an upper side in FIG. 4B) and a through electrode 14 (an electrode running through a resin section as described later) is formed on an upper surface thereof (a surface on a lower side in FIG. 4B).

Figure 5A:
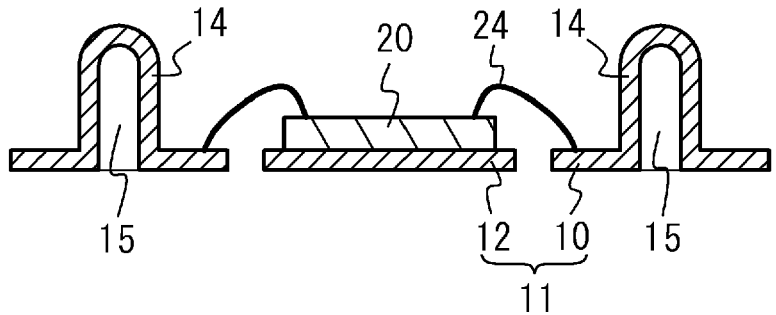
FIG. 5A is a view that illustrates aspects of the semiconductor manufacturing process of the first embodiment of the present invention.
Figure 5B:
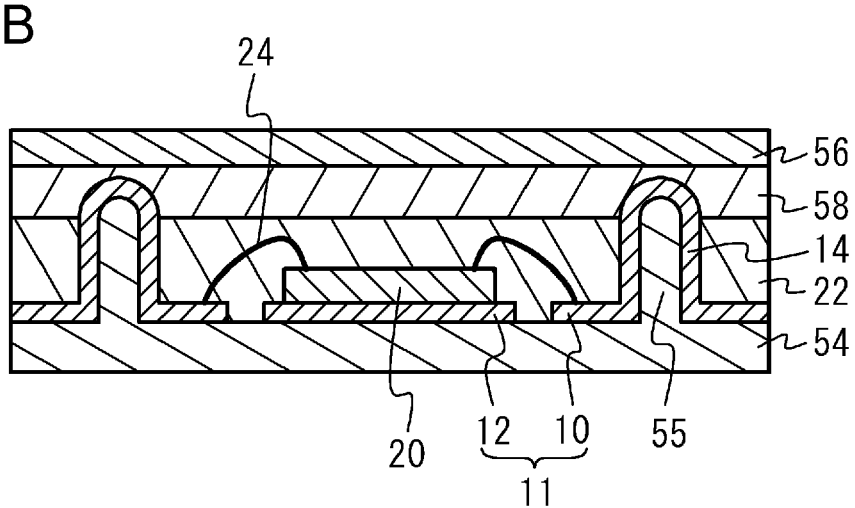
FIG. 5B is a view that illustrates aspects of the semiconductor manufacturing process of the first embodiment of the present invention.
Figure 5C:
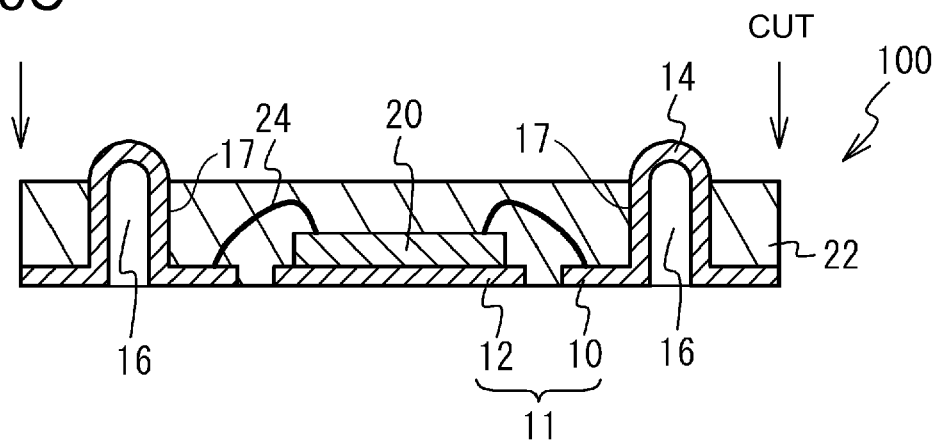
FIG. 5C is a view that illustrates aspects of the semiconductor manufacturing process of the first embodiment of the present invention.

With reference to FIG. 5A, on the mounting section 12 of the lead frame 11, a semiconductor chip 20 of silicon is mounted face up using an adhesive (not shown). The semiconductor chip 20 and the lead 10 are electrically coupled by using a bonding wire 24 of gold or copper. With reference to FIG. 5B, on a die 54, the lead frame 11 on which the semiconductor chip 20 is mounted is disposed. The die 54 is provided with a protrusion 55 corresponding to the recess 15 of the lead 10. A thermosetting epoxy resin, for example, is disposed on the lead frame 11. The resin is hot-pressed and the through electrode 14 of the lead 10 is placed against a die 56 via a release film 58 made of, for example, polytetrafluoroethylene of a fluorine system resin. By using the soft release film 58, a tip of the through electrode 14 is buried in the release film 58. As the resin is hardened, a resin section 22 is formed. With reference to FIG. 5C, the die 56 is removed from the release film 58. The die 54 is removed. In the resin section 22, a first through-hole 17 corresponding to the protrusion 55 of the die 54 and the through electrode 14 is formed. Further, inside the first through-hole 17, a cavity 16 which is defined by the through electrode 14 and the resin section 22 is formed. As the pointed tip of the through electrode 14 is buried in the release film 58, the tip of the through electrode 14 is not covered with the resin section 22 and the tip of the through electrode 14 is protruded from the resin section 22. By using a diamond grindstone, the resin section 22 can be cut and a semiconductor device 100 is separated. The exposed lead frame 11 is plated using solder. Further, a solder of tin, silver and copper may be embedded inside the cavity 16 to couple the through electrodes 14 to each other as described later in a second embodiment of the present invention.

Figure 6A:
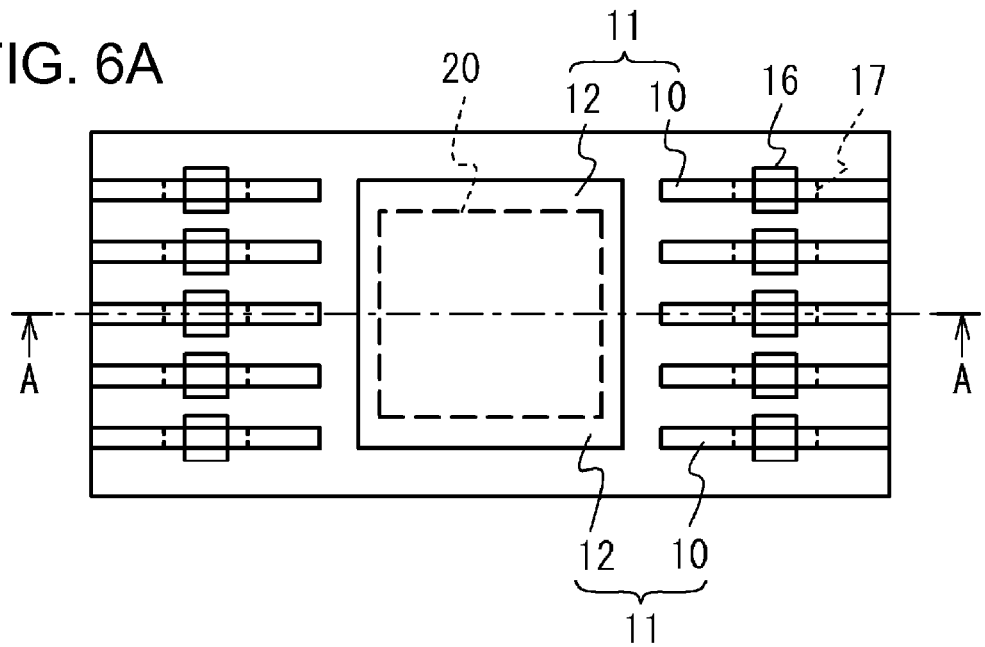
FIG. 6A is a bottom view of the semiconductor device of the first embodiment of the present invention 6A.
Figure 6B:
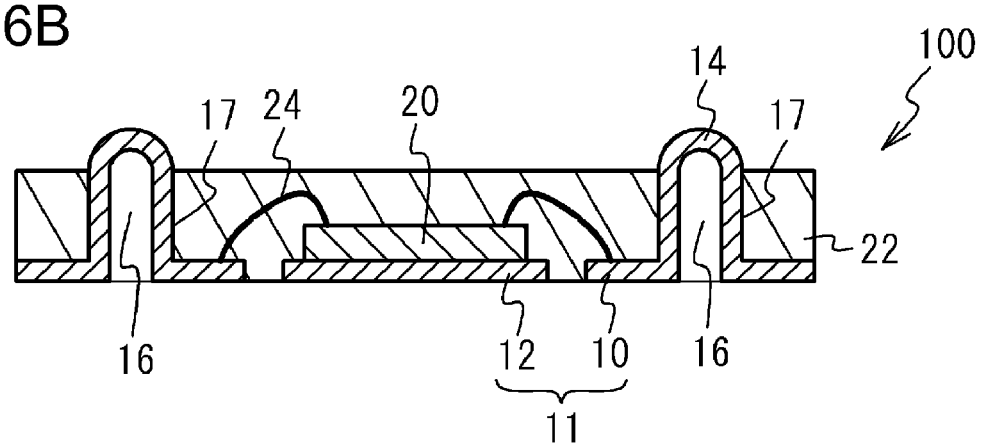
FIG. 6B is a cross-sectional view taken along the line A-A of FIG. 6A.

FIG. 6A is a bottom view of the first embodiment and FIG. 6B is a cross-sectional view thereof. With reference to FIGS. 6A and 6B, on the mounting section 12 of the lead frame 11, the semiconductor chip 20 is mounted. The semiconductor chip 20 is molded with the resin section 22. In the resin section 22, the first through-hole 17 is formed. On an inner surface of the first through-hole 17, the through electrode 14 which extends from a bottom edge through a top edge of the inner surface of the first through-hole 17 is provided. Inside the through electrode 14, the cavity 16 which extends through the planes corresponding to an upper surface and a lower surface of the resin section 22 is formed. The through electrode 14 and the semiconductor chip 20 are electrically coupled by the bonding wire 24. The tip of the through electrode 14 rises above the upper surface of the resin section 22.

According to the first embodiment, the through electrode 14 is provided so as to extend from a bottom edge through a top edge of the inner surface of the first through-hole 17. Therefore, by the through electrode 14, an electrode which electrically passes through the upper surface and the lower surface of the resin section 22 can be formed. Further, inside the first through-hole 17, the cavity 16 continuously running through planes corresponding to the upper surface and the lower surface of the resin section 22 is formed. Therefore, as in the hereinafter described second embodiment, stacking of semiconductor devices can be easily performed. Consequently, a plurality of semiconductor devices 100 can be stably stacked and the packaging density can be increased.

Second Embodiment

Figure 7:
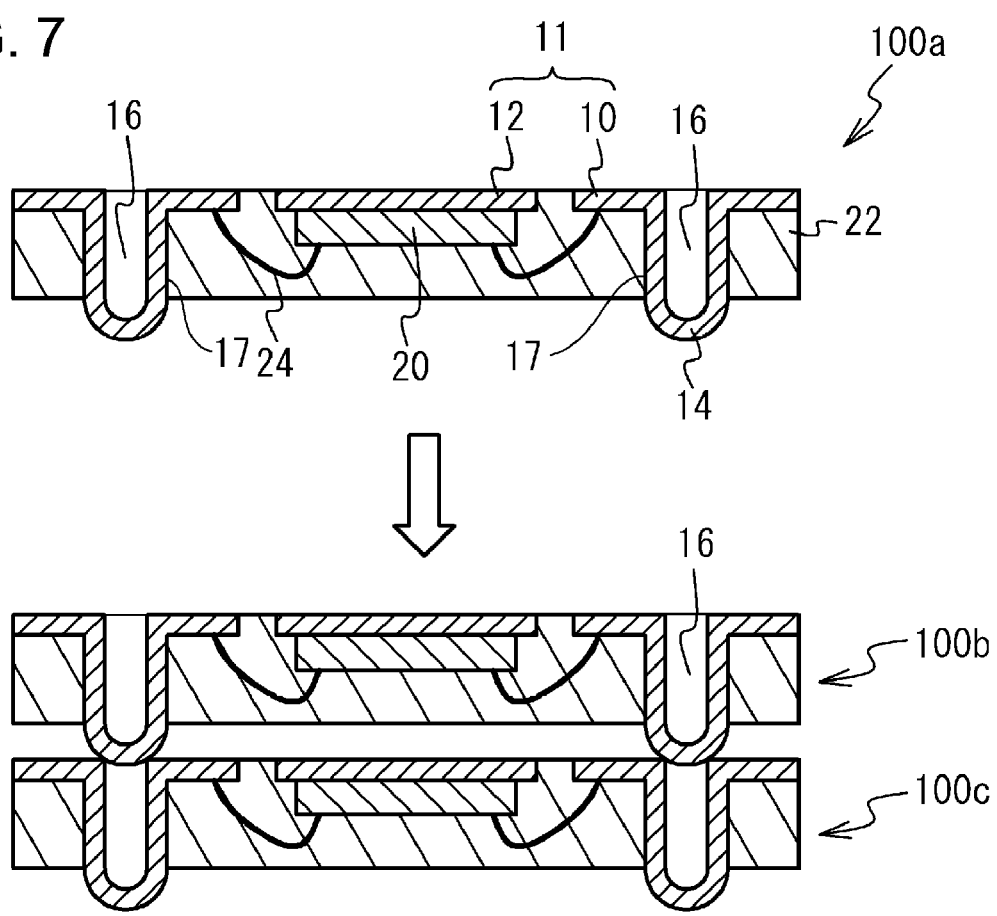
FIG. 7 is a cross-sectional view that illustrates aspects of a semiconductor device manufacturing process of a second embodiment of the present invention.

The second embodiment of the present invention features a stacked semiconductor device arrangement that involves a stacking of the semiconductor devices of the first embodiment. With reference to FIG. 7, electrical performance tests are initially carried out upon the semiconductor devices 100a to 100c of the first embodiment. The semiconductor device 100a is stacked over the semiconductor devices 100b and 100c. The semiconductor device 100a is stacked on the semiconductor device 100b so as to make the closed portion of the tip of the through electrode 14 of the semiconductor device 100a contact the cavity 16 of the semiconductor device 100b. More specifically, a plurality of semiconductor devices 100a to 100c are stacked so as to make the respective through electrodes 14 of a plurality of semiconductor devices, 100a to 100c, contact. In one embodiment, the through electrodes 14 may be mechanically and electrically coupled to each other by solder to complete the stacked semiconductor device arrangement of the second embodiment.

According to the second embodiment, the through electrode 14 that is provided on the inner surface of the first through-hole 17 which runs through the resin section 22 is closed above the upper surface of the resin section 22 and the protruded tip of the through electrode 14 of the upper semiconductor device 100a is fit inside the cavity 16 of the lower semiconductor device 100b. Therefore, the positioning of the upper and lower semiconductor devices 100a and 100b is simplified. Consequently, the semiconductor devices can be stably stacked. Further, since the through electrode 14 that is electrically coupled to the semiconductor chip 20 is exposed, individual semiconductor devices can be electrically tested before stacking.

Third Embodiment

Figure 8A:
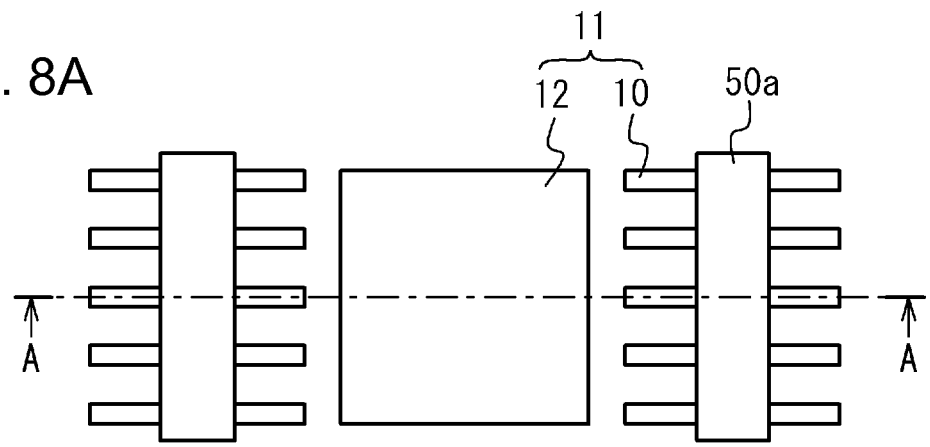
FIG. 8A is a top view that illustrates aspects of a semiconductor device manufacturing process of a third embodiment of the present invention.
Figure 8B:
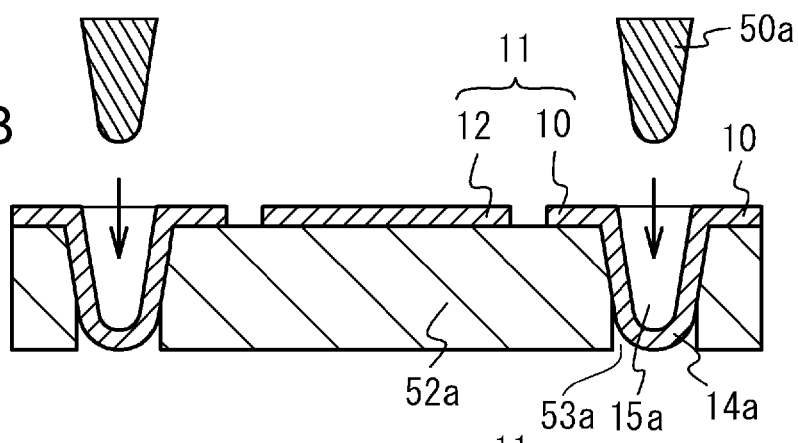
FIG. 8B is a cross-sectional view taken along the line A-A of FIG. 8A.
Figure 8C:
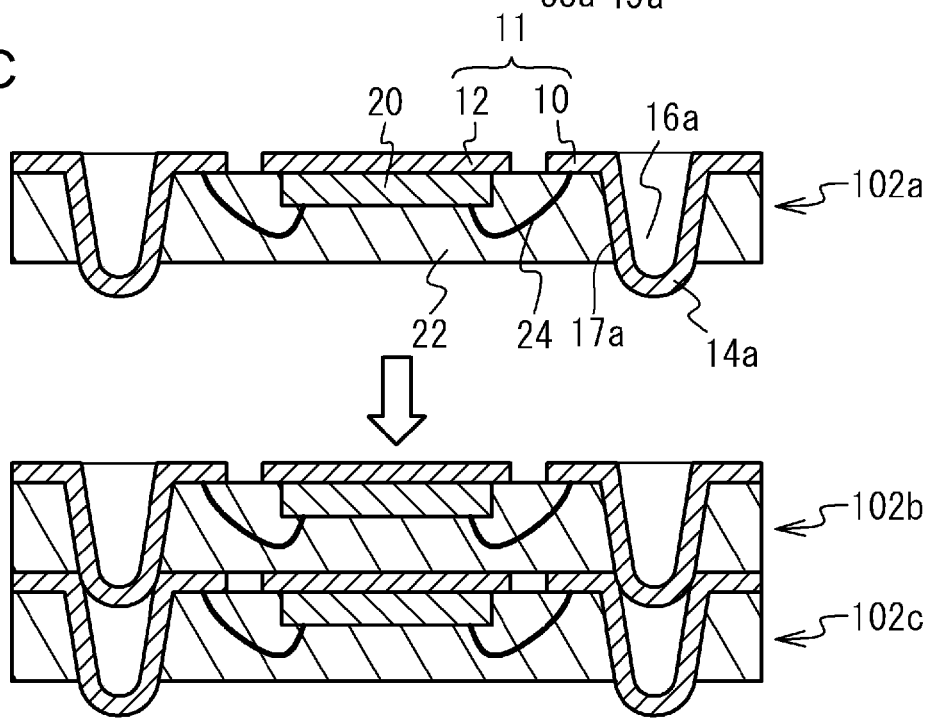
FIG. 8C is cross-sectional view taken along the line A-A of FIG. 8A.

A third embodiment of the present invention features a through electrode that has a cross sectional shape that is different from that of the first embodiment and the second embodiment. With reference to FIGS. 8A and 8B, in the same manner as those described with reference to FIGS. 4A and 4B of the first embodiment, using a die 52a having a hole 53a and a pressing die 50a, a through electrode 14a and a recess 15a are formed on a lead. The die 50a is a die with a width of which gets narrower towards the tip thereof compared with that of the die 50 of the first embodiment. Thereafter, the same processes as those described with reference to FIGS. 5A to 5C of the first embodiment are carried out to form a semiconductor device 102. With reference to FIG. 8C, by stacking semiconductor devices 102a to 102c, a stacked semiconductor device of the third embodiment is completed.

In the semiconductor device of the third embodiment, the through electrode 14a, the cavity 16a and the first through-hole 17a have cross-sectional shapes where the width thereof gets narrower towards the tips. Therefore, when stacking the semiconductor devices 102a to 102c, the through electrodes 14a are easily stacked. Consequently, the semiconductor devices 102a to 102c can be stacked more stably.

Fourth Embodiment

Figure 9A:
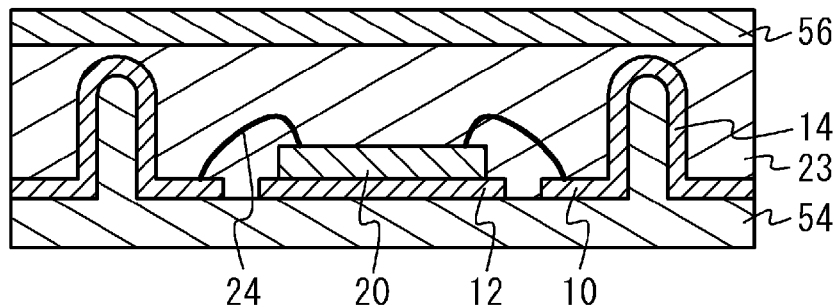
FIG. 9A is a cross-sectional view that illustrates aspects of a semiconductor device manufacturing process of a fourth embodiment of the present invention.
Figure 9B:
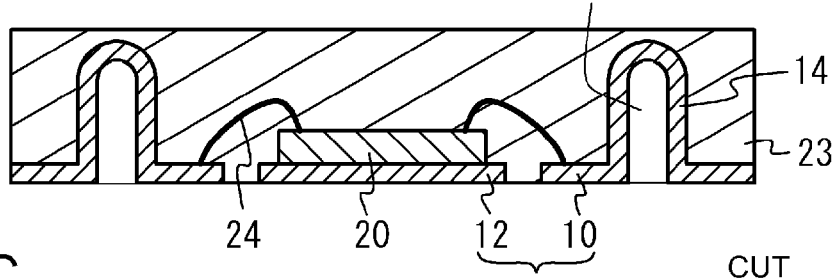
FIG. 9B is a cross-sectional view that illustrates aspects of a semiconductor device manufacturing process of a fourth embodiment of the present invention.
Figure 9C:
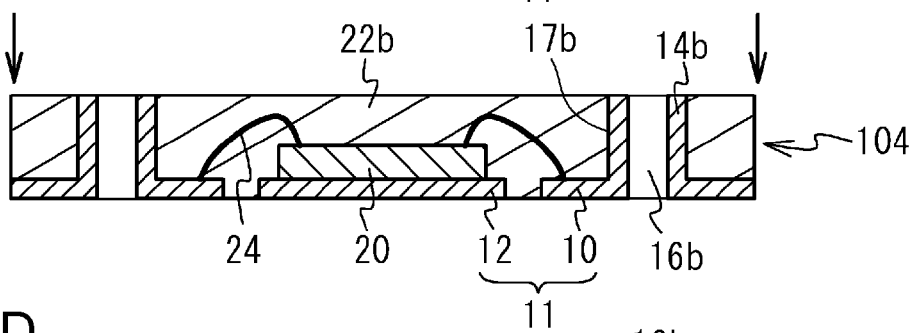
FIG. 9C is a cross-sectional view that illustrates aspects of a semiconductor device manufacturing process of a fourth embodiment of the present invention.

A fourth embodiment of the present invention features an upper surface of a through electrode that is coplanar with an upper surface of a resin section. With reference to FIGS. 9A to 9D, a method for manufacturing a semiconductor device of the fourth embodiment will be described. With reference to FIG. 9A, the processes described with reference to FIGS. 3A to 5A of the first embodiment are carried out. However, in FIG. 9A, the release film 58 is not used, unlike the embodiment shown in FIG. 5B. Other configurations are the same as those shown in FIG. 5B. With reference to FIG. 9B, the dies 54 and 56 are removed. A resin section 23 is formed so that the through electrode 14 is embedded in the resin section 23. Therefore, a cavity 19 of the resin section 23 does not run through the resin section 23. With reference to FIG. 9C, an upper surface of the resin section 23 is grinded so as to have the tip of the through electrode 14 removed. Consequently, a through electrode 14b is separated and the cavity 19 is made to run through the remaining resin section 22b and becomes a first through-hole 17b. Furthermore, inside the first through-hole 17b, a cavity 16b which occupies the space between the planes corresponding to an upper surface and a lower surface of the resin section 22b is formed. Furthermore, the through electrode 14b is provided with an opening at an upper surface of the through electrode 14b. It should be appreciated that the upper surface of the through electrode 14b is coplanar with the upper surface of the resin section 22b. The exposed surface of the lead frame 11 is plated by solder. The resin section 22 is separated to complete a semiconductor device 104.

Figure 9D:
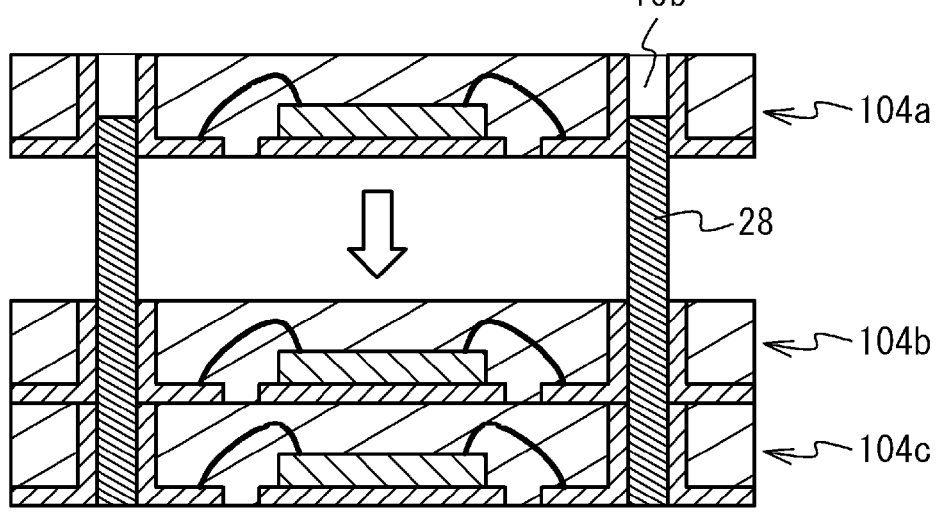
FIG. 9D is cross-sectional view that illustrates aspects of a semiconductor device manufacturing process of a fourth embodiment of the present invention.

With reference to FIG. 9D, a plurality of semiconductor devices 104a to 104c are stacked. Stacking is facilitated by a conductive connecting pin 28 of copper, for example, passing through the first through-hole 17b and by electrically and mechanically coupling the through electrode 14b and the connecting pin 28 by using, for example, solder (not shown). According to the fourth embodiment, since the connecting pin 28 is passed through inside the cavity 16b, the displacement of the upper and lower semiconductor devices 104a to 104c relative to each other can be prevented.

Fifth Embodiment

Figure 10A:
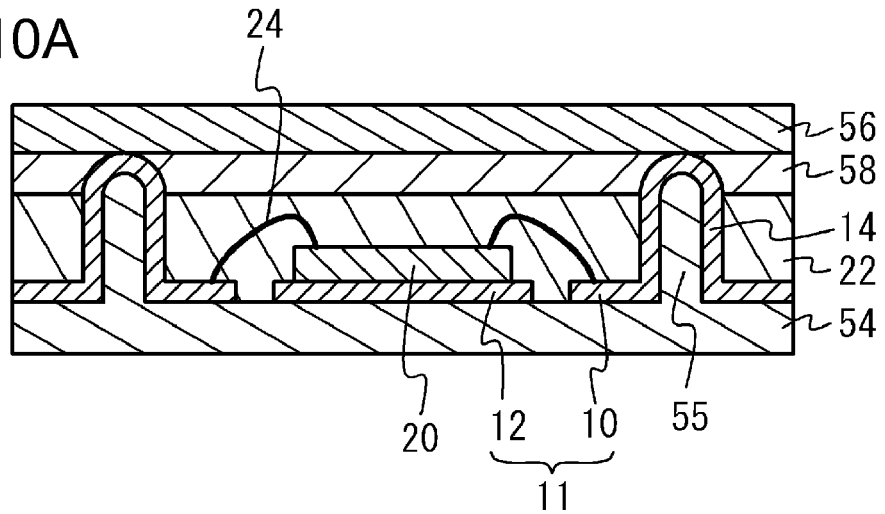
FIG. 10A is a cross-sectional view that illustrates aspects of a semiconductor device manufacturing process of a fifth embodiment of the present invention.
Figure 10B:
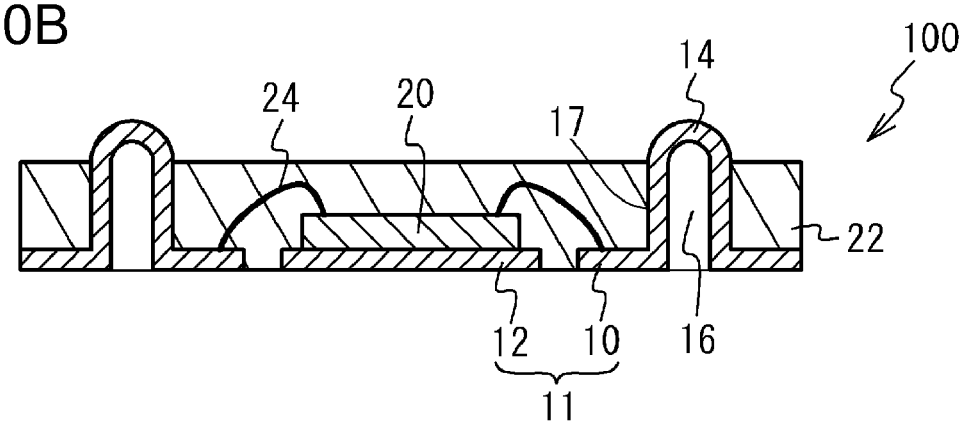
FIG. 10B is a cross-sectional view that illustrates aspects of a semiconductor device manufacturing process of a fifth embodiment of the present invention.
Figure 10C:
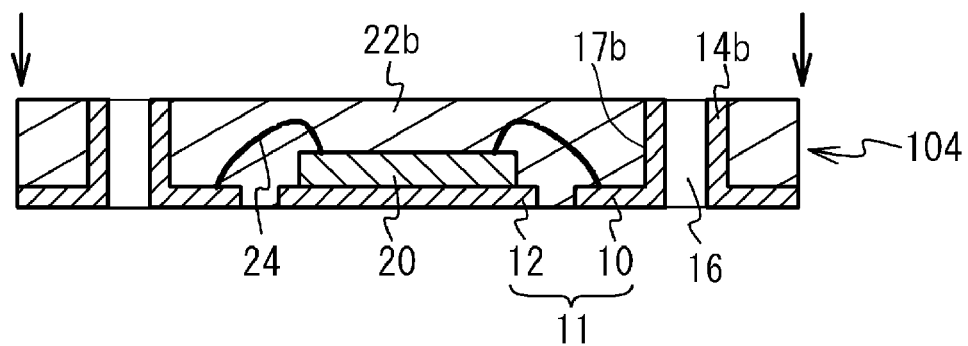
FIG. 10C is a cross-sectional view that illustrates aspects of a semiconductor device manufacturing process of a fifth embodiment of the present invention.

FIGS. 10A to 10C illustrate a method for manufacturing a semiconductor device of a fifth embodiment of the present invention. With reference to FIG. 10A, the same processes as those described with reference to FIGS. 3A to 5B of the first embodiment are carried out. With reference to FIG. 10B, as previously shown in FIG. 5C of the first embodiment, the tip of the through electrode 14 is protruded from the resin section 22. With reference to FIG. 10C, the tip of the through electrode 14 is grinded down to the resin section 22. Therefore, a first through-hole 17b is opened at an upper surface of the through electrode 14b. Furthermore, the upper surface of the through electrode 14b is coplanar with an upper surface of the resin section 22b. Thereafter, the same processes as those described with reference to FIGS. 9C to 9D of the fourth embodiment are carried out.

When forming the resin section 22, as previously shown in FIG. 9C regarding the fourth embodiment and in FIG. 10C regarding the fifth embodiment, the upper surface of the through electrode 14 is removed so as to create an opening at the upper surface of the through electrode 14. Consequently, a first through-hole 17b that can accommodate the insertion of a connector pin can be formed.

In the removal of the upper portion of the through electrode 14, the upper portion of the through electrode 14 can be removed such that the upper surface of the through electrode 14b is coplanar with the upper surface of the resin section 22. Consequently, the semiconductor device can be formed to have a low-profile. In one embodiment, the through electrode 14 may be embedded in the resin section 23 as shown in FIG. 9B of the fourth embodiment and then the through electrode 14 and the resin section 23 may be grinded as shown in FIG. 9C, or the through electrode 14 may be grinded such that the tip of the through electrode 14 protrudes from the resin section 23.

As illustrated in the first embodiment to the fifth embodiment, by pressing a part of the lead 10 of the lead frame 11, the through electrode 14 can be formed from the lead 10. In this manner, the formation of through electrode 14 can be easily performed.

Sixth Embodiment

Figure 11A:
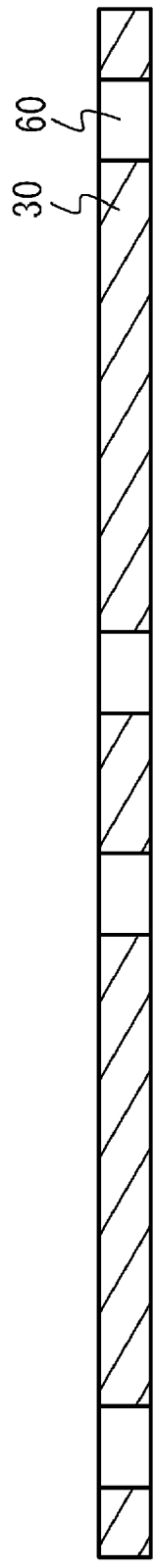
FIG. 11A is a cross-sectional view that illustrates aspects of a semiconductor device manufacturing process of a sixth embodiment of the present invention.
Figure 11B:
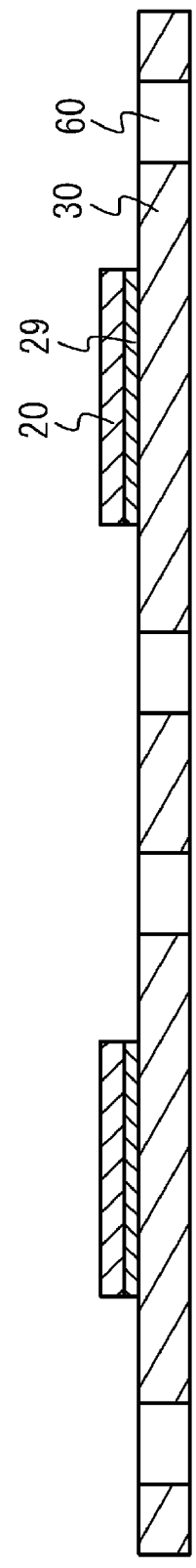
FIG. 11B is a cross-sectional view that illustrates aspects of a semiconductor device manufacturing process of a sixth embodiment of the present invention.
Figure 11C:
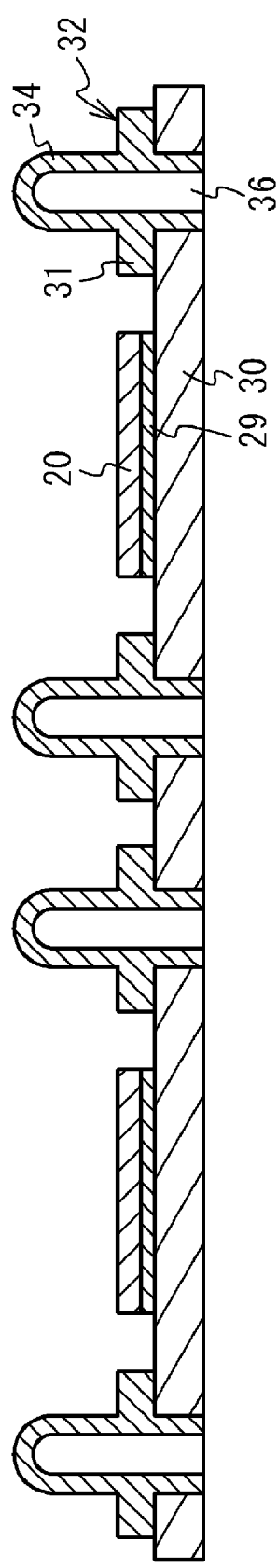
FIG. 11C is a cross-sectional view that illustrates aspects of a semiconductor device manufacturing process of a sixth embodiment of the present invention.

A sixth embodiment of the present invention features the use of a dedicated pin as a through electrode. With reference to FIGS. 11A to 13C, a method for manufacturing a semiconductor device of the sixth embodiment will be described. With reference to FIG. 11A, on an insulating substrate 30 of, for example, glass epoxy of a film thickness of between 0.1 mm and 0.4 μm, a second through-hole 60 with a pore diameter of about 0.4 mm is formed. In one embodiment, the pore diameter is preferably greater than 0.3 mm. With reference to FIG. 11B, on the substrate 30, the semiconductor chip 20 is mounted by using an adhesive 29. With reference to FIG. 11C, a through pin 32 is inserted into the second through-hole 60. In one embodiment, the outer diameter of the through electrode 34 of the through pin 32 may be slightly larger than the diameter of the second through-hole 60 of the substrate 30. Therefore, the through pin 32 may be fixed to the substrate 30.

Figure 12A:
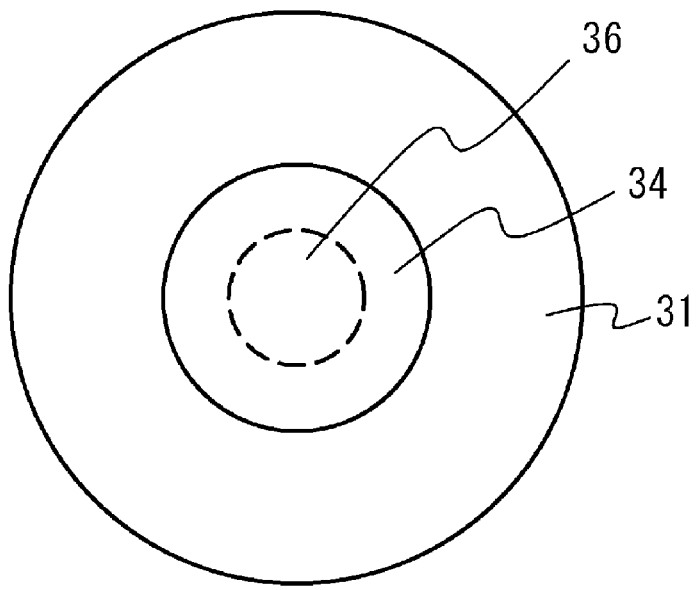
FIG. 12A is a top view of a through pin according to one embodiment of the present invention.
Figure 12B:
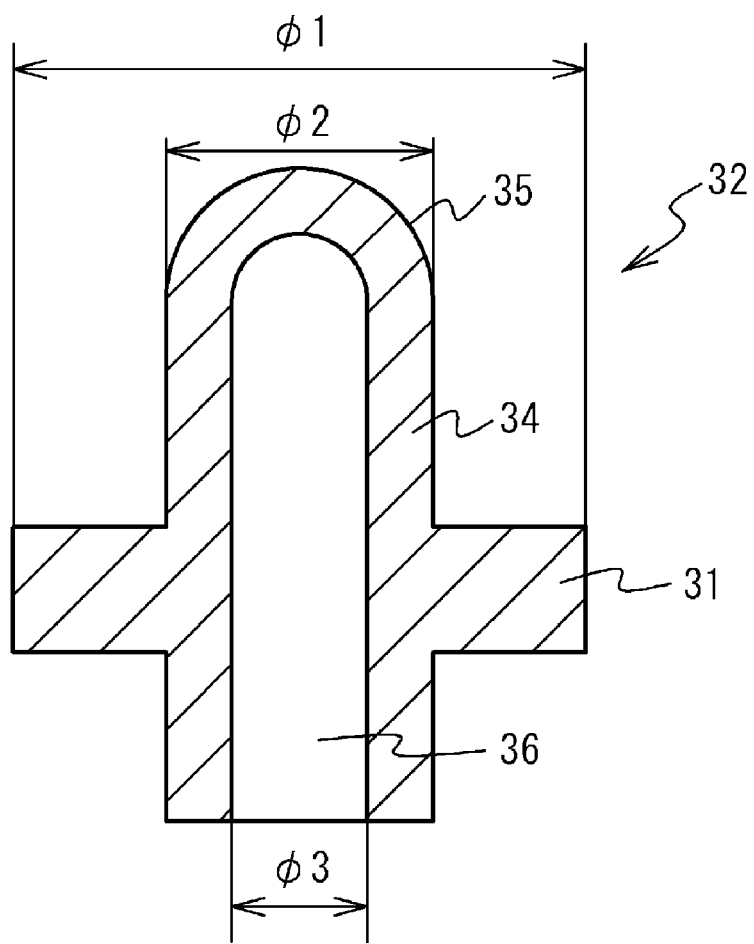
FIG. 12B is a cross-sectional view of the through pin of FIG. 12A according to one embodiment of the present invention.

FIG. 12A is a top view of the through pin 32 and FIG. 12B is a cross-sectional view thereof. The through pin 32 is made of, for example, phosphor-bronze (the surface thereof may be gold or copper plated) and is composed of the through electrode 34 and a flange 31. A tip 35 of the through electrode 34 is closed and the through pin 32 has a cavity 36 inside the through electrode 34. The flange 31 serves as a stopper when inserting the through pin 32 to the second through-hole 60 of the substrate 30 and as a pad where a bonding wire to be coupled to the semiconductor chip 20 may be affixed. In one embodiment, an outer diameter $\phi 1$ of the flange 31 is preferably 1 mm or less in order to facilitate semiconductor device miniaturization. An outer diameter $\phi 2$ of the through electrode 34 is preferably 2 to 8 μm larger than the second through-hole 60 of the substrate 30 and is preferably greater than 0.3 mm. An inner diameter of the through electrode 34, e.g., the diameter $\phi 3$ of the cavity 36, is preferably about 0.1 mm smaller than $\phi 2$. For example, settings of $\phi 1$ to be 0.9 mm, $\phi 2$ to be 0.4 mm and $\phi 3$ to be 0.3 mm may be used.

Figure 13A:
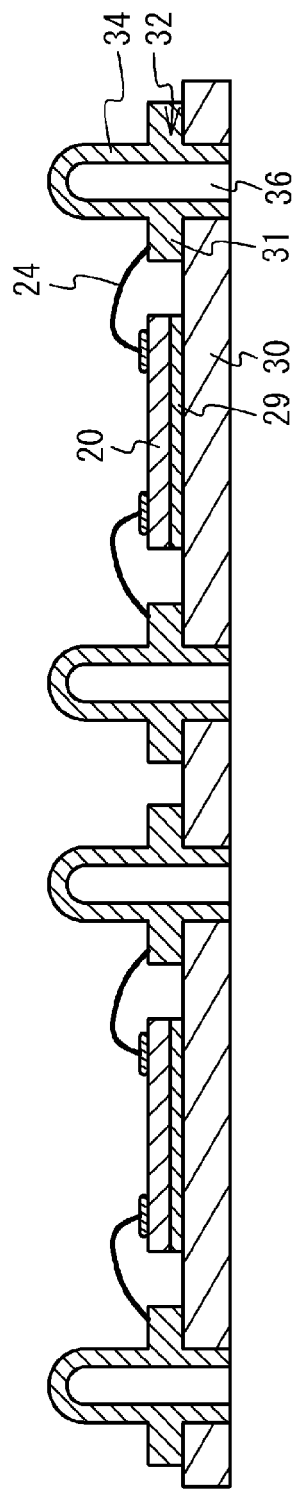
FIG. 13A is a cross-sectional view that illustrates aspects of a semiconductor device manufacturing process of the sixth embodiment of the present invention.
Figure 13B:
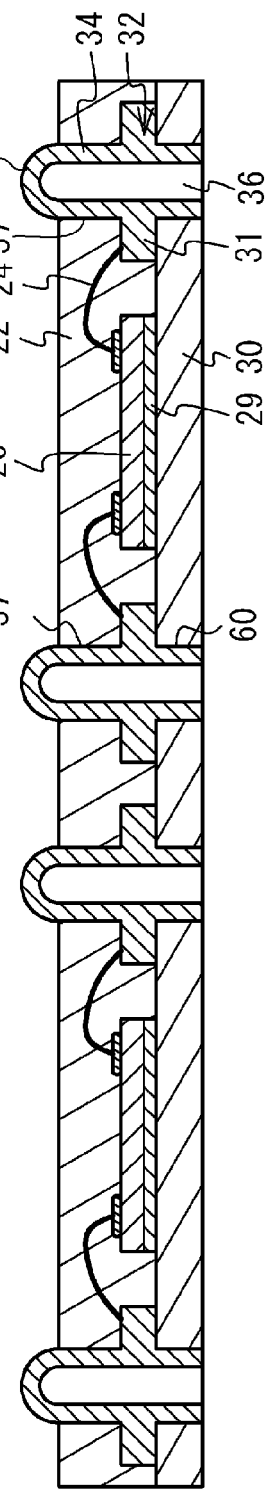
FIG. 13B is a cross-sectional view that illustrates aspects of a semiconductor device manufacturing process of the sixth embodiment of the present invention.
Figure 13C:
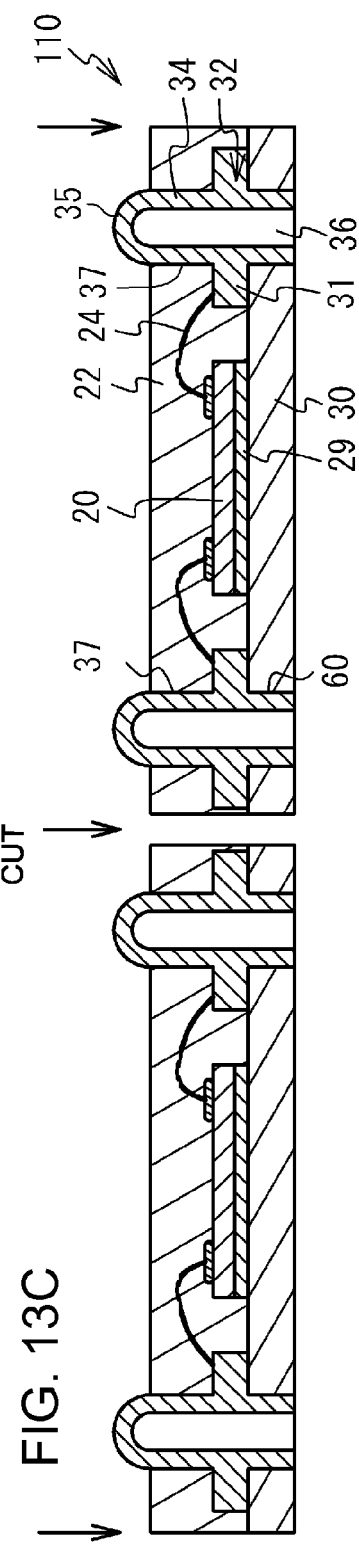
FIG. 13C is a cross-sectional view that illustrates aspects of a semiconductor device manufacturing process of the sixth embodiment of the present invention.

With reference to FIG. 13A, the semiconductor chip 20 and the flange 31 of the through pin 32 are coupled by using the bonding wire 24. Therefore, the through electrode 34 and the semiconductor chip 20 are electrically coupled. With reference to FIG. 13B, by molding the semiconductor chip 20 and the bonding wire 24 using a thermosetting epoxy resin, the resin section 22 is formed. The resin section 22 is formed, by using a release film as shown in FIG. 5B of the first embodiment, so that the tip 35 of the through electrode 34 is protruded. Using the through electrode 34, the first through-hole 37 running through the resin section 22 is formed. Therefore, the first through-hole 37 is communicated with the second through-hole 60 and the resin section 22 is formed so that the through electrode 34 runs through the resin section 22 and the substrate 30. With reference to FIG. 13C, by using a grindstone (e.g., diamond etc.), the resin section 22 and the substrate 30 may be cut, and a semiconductor device 110 may be separated (see FIG. 14B).

Figure 14A:
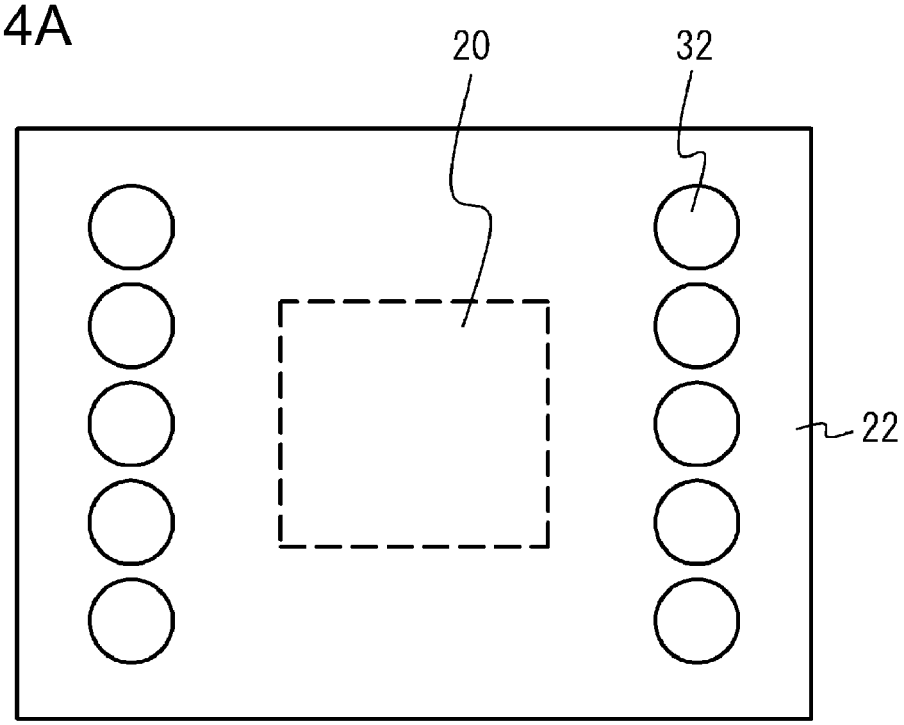
FIG. 14A is a top view of a semiconductor device manufactured in accordance with the sixth embodiment of the present invention.
Figure 14B:
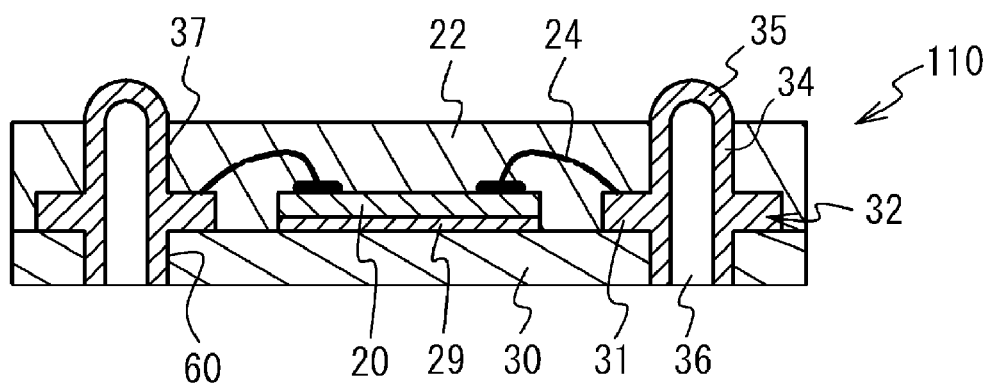
FIG. 14B is a cross-sectional view of the semiconductor device shown in FIG. 14A.

FIG. 14A is a top view of the semiconductor device of the sixth embodiment and FIG. 14B is a cross-sectional view thereof. With reference to FIGS. 14A and 14B, on the substrate 30, the semiconductor chip 20 is mounted via the adhesive 29. The through pin 32 is fixed on the substrate 30. The semiconductor chip 20 and the flange 31 of the through pin 32 are electrically coupled by the bonding wire 24. The semiconductor chip 20 and the bonding wire 24 are molded with the resin section 22. The tip 35 of the through electrode 34 is protruded from the resin section 22. The tip 35 of the through electrode 34 is closed above the upper surface of the resin section 22.

According to the sixth embodiment, the through electrode 34 is provided so as to extend through the top edges and bottom edges of the inner surfaces of the first through-hole 37 and the second through-hole 60. Therefore, by means of the through electrode 34, an electrode which electrically passes through an upper surface and a lower surface of the semiconductor device 110 can be formed. Further, because the first through-hole 37 and the second through-hole 60 are provided, as described below in a seventh embodiment of the present invention, the stacking of semiconductor devices can be easily carried out. Consequently, a plurality of semiconductor devices 110 can be stably stacked and packaging density can be increased.

Seventh Embodiment

Figure 15A:
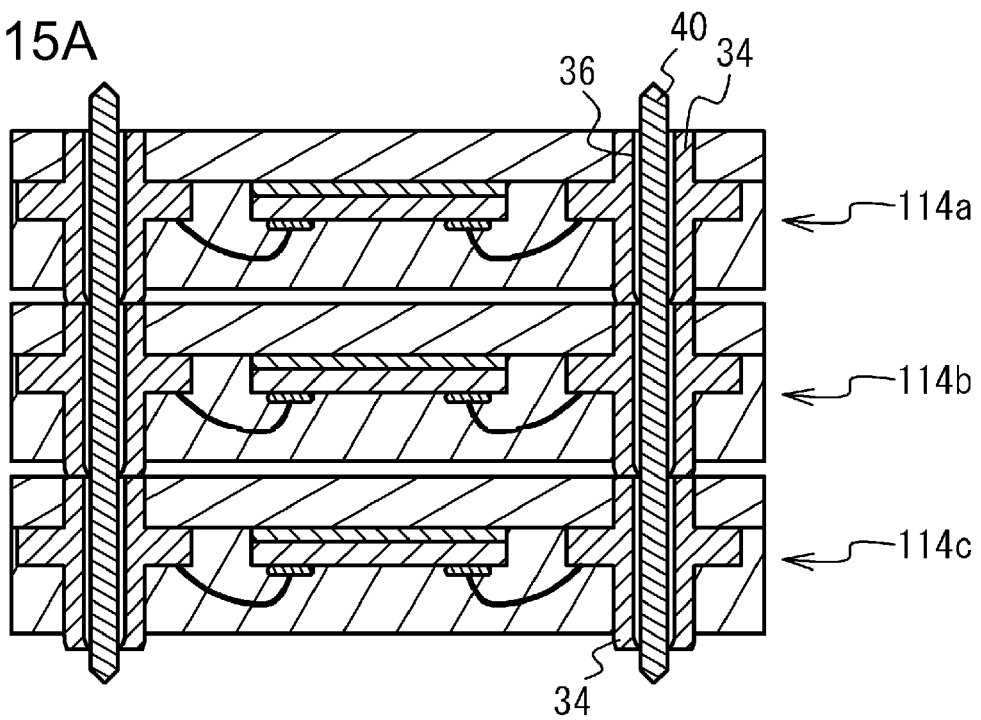
FIG. 15A is a cross-sectional view of a semiconductor device of a seventh embodiment of the present invention.

A seventh embodiment of the present invention features a stacking of the semiconductor devices of the sixth embodiment. With reference to FIG. 15A, semiconductor devices 110a to 110c are stacked such that the respective through electrodes 34 are stacked together. In order to make a conductive pin 40 directly contact each of the through electrodes 34, the conductive pin 40 is passed through the cavities 36 inside the through electrodes 34 of the plurality of semiconductor devices 114a to 114c. Therefore, at the tip of the through electrode 34, the conductive pin 40 directly makes contact with the through electrode 34 and is electrically coupled and mechanically fixed. Consequently, as the use of solder to couple the through electrodes 34 to each other is not required, the semiconductor devices 114a to 114c can be stacked without going through any heat treatment. When the semiconductor devices 114a to 114c is heat treated, mechanical deformation and deterioration in electrical performance may result. According to the seventh embodiment, because the semiconductor devices are stacked without going through any heat treatment, the semiconductor devices can be more stably stacked. Further, as the semiconductor devices 114a to 114c are not fixed to the conductive pin 40 by solder, the semiconductor devices 114a to 114c can be easily removed. Therefore, replacements and further measurements of semiconductor devices can be easily carried out.

Figure 15B:
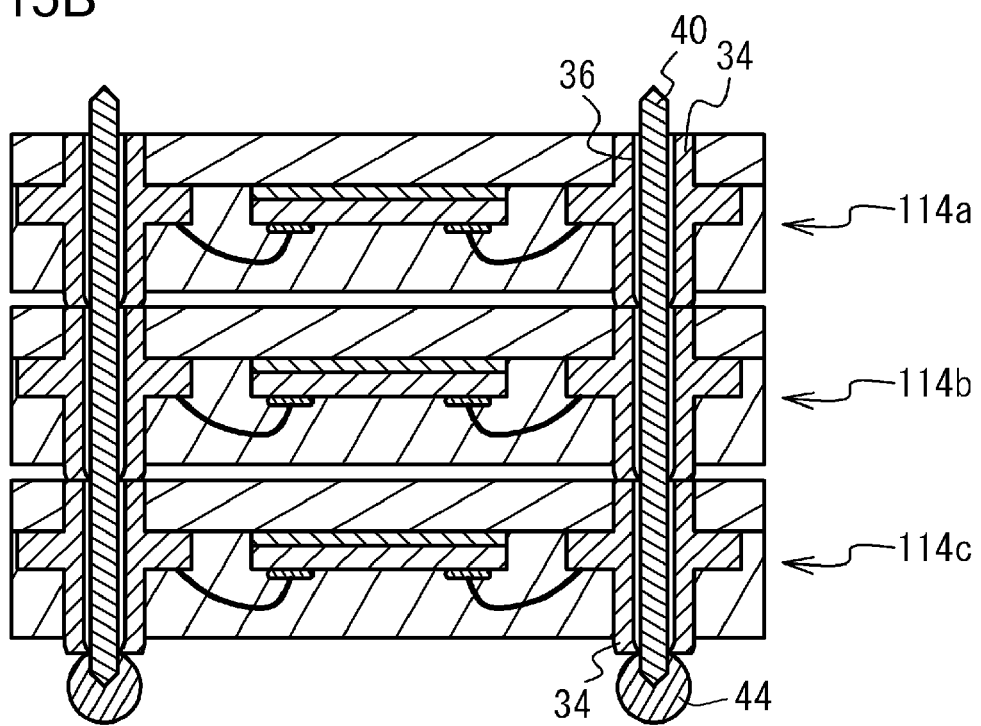
FIG. 15B is a cross-sectional view of a semiconductor device of a seventh embodiment of the present invention.

With reference to FIG. 15B, at the tip of the conductive pin 40, an external terminal 44 of solder may be formed. By the external terminal 44, the semiconductor device of the seventh embodiment can be flip-chip bonded onto a mounting substrate.

Eighth Embodiment

Figure 16A:
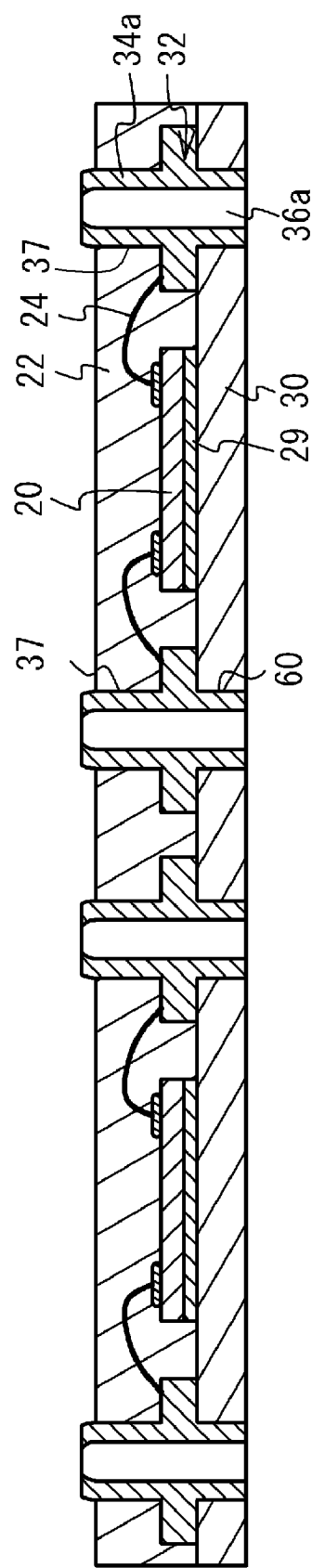
FIG. 16A is a cross-sectional view that illustrates aspects of a semiconductor device manufacturing process of an eighth embodiment of the present invention.
Figure 16B:
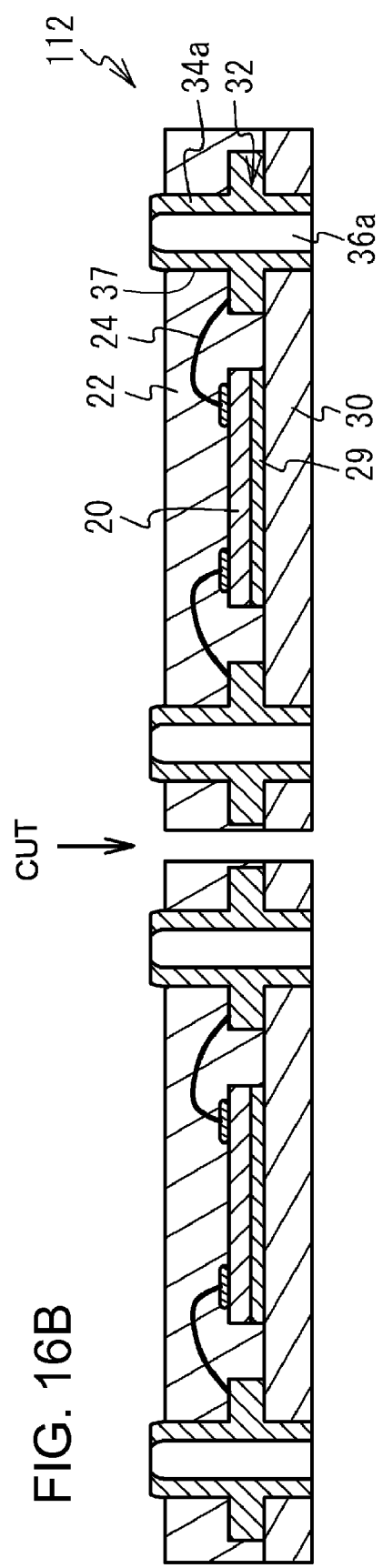
FIG. 16B is a cross-sectional view that illustrates aspects of a semiconductor device manufacturing process of an eighth embodiment of the present invention.

An eighth embodiment of the present invention features the removal of a top portion of a through electrode. With reference to FIG. 16A, the processes described with reference to FIGS. 11A to 13B of the sixth embodiment are initially carried out. Thereafter, a top portion of a through electrode 34a is removed by grinding. In this embodiment, the through electrode 34a is not grinded down to be coplanar with the upper surface of the resin section 22. With reference to FIG. 16B, the resin section 22 and the substrate 30 are cut and a semiconductor device 112 is separated.

Figure 17:
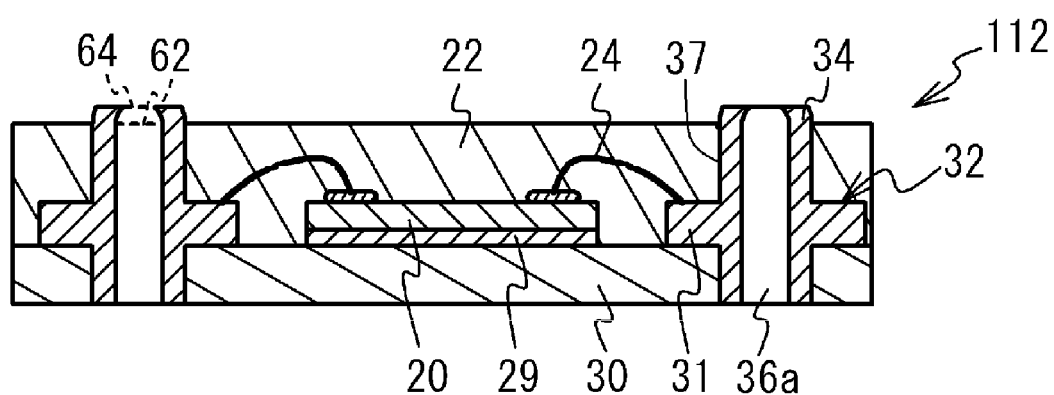
FIG. 17 is a cross-sectional view of the semiconductor device of the eighth embodiment of the present invention.

FIG. 17 is a cross-sectional view of the semiconductor device of the eighth embodiment. The upper surface of the through electrode 34 is higher than the upper surface of the resin section 22, and a cross section 64 of an opening defined by the upper surface of the through electrode 34 is smaller than a cross section 62 of a cavity 36a defined by the plane corresponding to the upper surface of the resin section 22.

According to the eighth embodiment, because the upper surface of the through electrode 34 is open, when stacking the semiconductor devices 112 as described in the seventh embodiment, the conductive pin 40 is not required to break through the tip of the through electrode 34. Therefore, the conductive pin 40 can easily pass through each of the through electrodes 34 of the plurality of semiconductor devices 112. Furthermore, the cross section 64 of the opening defined by the upper surface of the through electrode 34 is smaller than the cross section 62 of the cavity 36a defined by the plane corresponding to the upper surface of the resin section 22. Consequently, by passing the conductive pin 40 through the through electrode 34, the conductive pin 40 can directly make contact with the through electrode 34 and the conductive pin 40 and the through electrode 34 can be electrically and mechanically coupled. In one embodiment, in order to electrically and mechanically couple the conductive pin 40 and the through electrode 34, the cross section 60 of the opening defined by the upper surface of the through electrode 34 is preferably smaller than a cross section of the conductive pin 40.

Ninth Embodiment

Figure 18A:
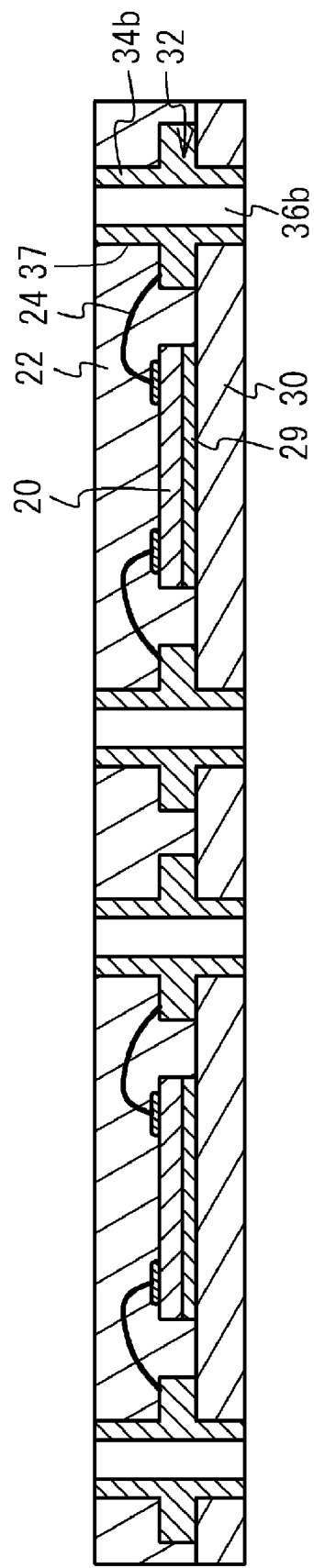
FIG. 18A is a cross-sectional view that illustrates aspects of a semiconductor device manufacturing process of a ninth embodiment of the present invention.
Figure 18B:
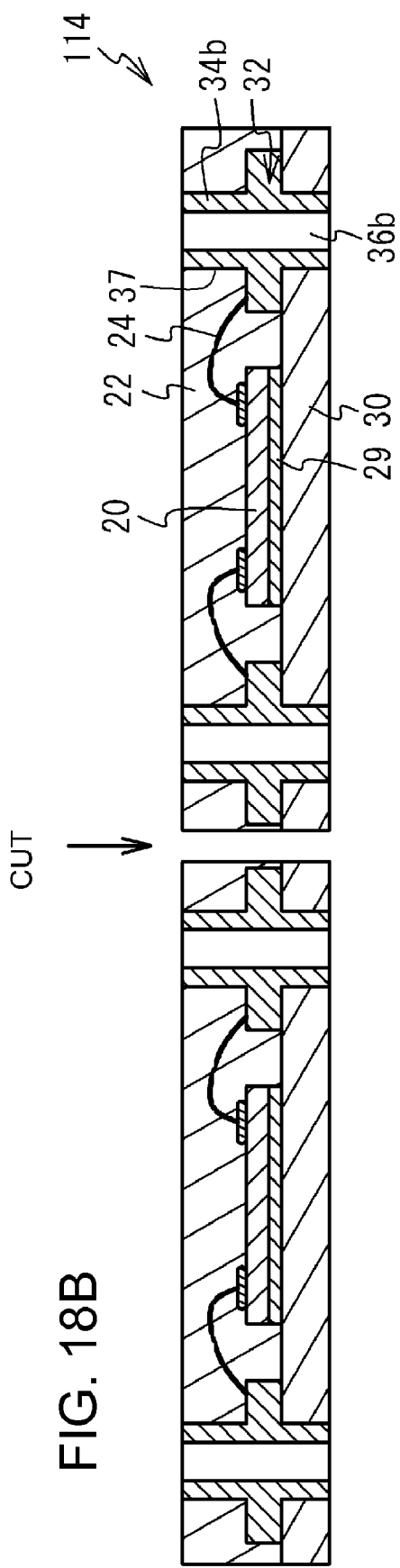
FIG. 18B is a cross-sectional view that illustrates aspects of a semiconductor device manufacturing process of a ninth embodiment of the present invention.

A ninth embodiment of the present invention features an upper surface of a through electrode that is coplanar with an upper surface of a resin section. With reference to FIG. 18A, the processes described with reference to FIGS. 11A to 13B of the sixth embodiment are initially performed. In one embodiment, a top portion of a through electrode 34b is removed by grinding. In this embodiment, the top surface of the through electrode 34b is removed so that an upper surface of the through electrode 34b is coplanar with the upper surface of the resin section 22. With reference to FIG. 18B, the resin section 22 and the substrate 30 are cut and a semiconductor device 114 is separated.

Figure 19:
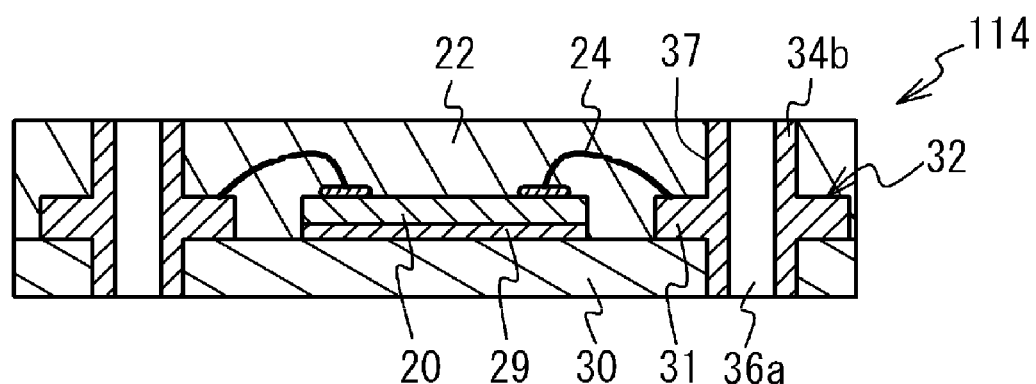
FIG. 19 is a cross-sectional view of the semiconductor device of the ninth embodiment of the present invention.

FIG. 19 is a cross-sectional view of the semiconductor device of the ninth embodiment. The upper surface of the through electrode 34 is coplanar with the upper surface of the resin section 22. A cross section of a cavity 36a inside the through electrode 34b is virtually uniform. According to the ninth embodiment, the semiconductor device can be manufactured to posses a low-profile.

Tenth Embodiment

Figure 20A:
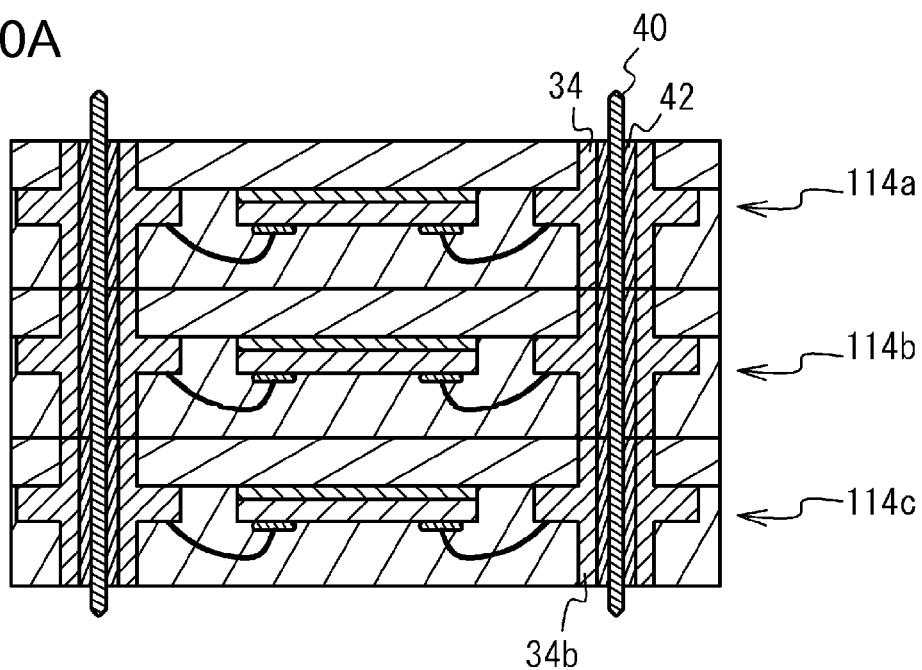
FIG. 20A is a cross-sectional view of a semiconductor device of a tenth embodiment of the present invention.
Figure 20B:
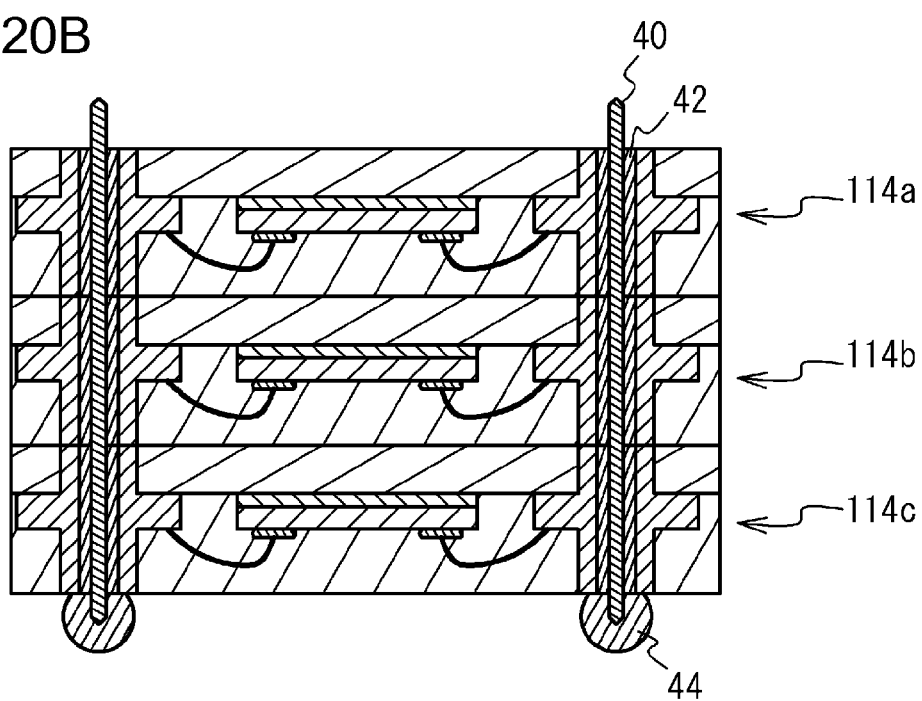
FIG. 20B is a cross-sectional view of a semiconductor device of a tenth embodiment of the present invention.

A tenth embodiment of the present invention features the stacking of the semiconductor devices of the ninth embodiment. With reference to FIG. 20A, semiconductor devices 114a to 114c are stacked such that the respective through electrodes 34 are stacked together. The conductive pin 40 is passed through cavities 36b of the through electrodes 34 of the plurality of semiconductor devices 114a to 114c. The conductive pin 40 and the through electrode 34 are electrically coupled by using a conductor 42 such as solder. As shown in FIG. 20B, at the tip of the conductive pin 40, an external terminal 44 of solder may be formed. As illustrated in the sixth embodiment to the tenth embodiment, by mounting a semiconductor chip on a substrate and by using a through pin 32 in place of a lead, a through electrode may be formed.

To summarize, in one embodiment of the present invention, there is provided a semiconductor device that includes, a semiconductor chip, a resin section that molds the semiconductor chip and has a first through-hole and a through electrode that is electrically coupled to the semiconductor chip, extends through the resin section, and extends through a top edge and a bottom edge of an inner surface of the first through-hole. A cavity which is formed between planes corresponding to an upper surface and a lower surface of the resin section is formed inside the first through-hole. Utilizing exemplary embodiments of the present invention, stacking of semiconductor devices can be easily performed. Consequently, a plurality of semiconductor devices can be stably stacked, whereby the packaging density can be increased.

In one embodiment, the semiconductor device may include a stack of more than one semiconductor device. In this embodiment, a through electrode of each of the semiconductor devices may be in contact with a through electrode of the others. According to the present invention, a plurality of semiconductor devices can be stably stacked, whereby the packaging density can be increased.

In one embodiment, the semiconductor device may include a stack of more than one semiconductor device, and a conductive pin that penetrates through a cavity provided in each of the semiconductor devices to directly contact a through electrodes, so as to be electrically coupled with the through electrodes. According to the present invention, semiconductor devices can be stacked without going through any heat treatment, whereby semiconductor devices can be stacked with additional stability.

In one embodiment, the semiconductor device may include a stack of more than one semiconductor device, coupled by a conductive pin that penetrates through the cavity provided in each of the semiconductor devices, so as to electrically couple the semiconductor devices.

In one embodiment, a method for manufacturing a semiconductor device may include electrically coupling a through electrode and a semiconductor chip with each other and forming a resin section that molds the semiconductor chip, so that the through electrode extends through a top edge and a bottom edge of an inner surface of a first through-hole that penetrates through the resin section. This forms a cavity which extends through planes corresponding to an upper surface and a lower surface of the resin section inside the first through-hole. According to the present invention, using the aforementioned through-hole, the stacking of semiconductor devices can be easily performed. Consequently, a plurality of semiconductor devices can be stably stacked and packaging density can be increased.

In one embodiment, a method may include stacking more than one semiconductor device mentioned above, so that the through electrodes of each of the plurality of semiconductor devices make contact. According to this embodiment a plurality of semiconductor devices can be stably staked, whereby the packaging density can be increased.

In one embodiment, a method may include stacking more than one semiconductor device and penetrating the cavity provided in each of the semiconductor devices with a conductive pin, so that the conductive pin directly contacts the through electrode. According to the present invention, the semiconductor devices can be stacked without going through any heat treatment, whereby semiconductor devices can be stacked stably.

In one embodiment, the method may include stacking more than one semiconductor device by penetrating a cavity provided in each of the semiconductor devices with a conductive pin and electrically coupling the conductive pin and the through electrode with each other. It should be appreciated that because the through hole described herein is formed from the lead frame, a package component is reduced.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

The invention claimed is:

1. A semiconductor device comprising:
   a semiconductor chip;
   a resin section that encases the semiconductor chip, and has a first through-hole; and
   a through electrode that is electrically coupled to the semiconductor chip, and extends through the resin section and through a top edge and a bottom edge of an inner surface of the first through-hole, wherein a cavity which extends between planes corresponding to an upper surface and a lower surface of the resin section is formed inside the first through-hole and wherein the through electrode is formed so that the first through-hole is closed above the plane corresponding to the upper surface of the resin section and the semiconductor device is one of a stack of more than one semiconductor devices and comprises a conductive pin that penetrates a cavity provided in each of the semiconductor devices and directly contacts the through electrode, so as to be electrically coupled with the through electrode.

2. The semiconductor device according to claim 1, wherein an upper surface of the through electrode is coplanar with the upper surface of the resin section.

3. The semiconductor device according to claim 1, wherein the semiconductor device is one of a stack of more than one semiconductor devices wherein a through electrode of each of the semiconductor devices of the stack contacts the other.

4. The semiconductor device according to claim 2 wherein the semiconductor device is one of a stack of more than one semiconductor devices, and comprises a conductive pin that penetrates through the cavity provided in each of the semiconductor devices, so as to be electrically coupled with the semiconductor devices.

* * * * *